United States Patent
Daiss

(10) Patent No.: US 9,857,429 B2
(45) Date of Patent: Jan. 2, 2018

(54) DEVICE AND METHOD FOR DETERMINING A RANGE OF A BATTERY CHARACTERISTIC CURVE

(75) Inventor: Armin Daiss, Regensburg (DE)

(73) Assignee: Continental Automotive GmbH, Hannover (DE)

(*) Notice: Subject to any disclaimer, the term of this patent is extended or adjusted under 35 U.S.C. 154(b) by 1511 days.

(21) Appl. No.: 13/577,189

(22) PCT Filed: Feb. 2, 2011

(86) PCT No.: PCT/EP2011/051473
§ 371 (c)(1),
(2), (4) Date: Oct. 5, 2012

(87) PCT Pub. No.: WO2011/095513
PCT Pub. Date: Aug. 11, 2011

(65) Prior Publication Data
US 2013/0204561 A1    Aug. 8, 2013

(30) Foreign Application Priority Data
Feb. 5, 2010   (DE) .................. 10 2010 006 965

(51) Int. Cl.
*G01R 31/36* (2006.01)
*H02J 7/00* (2006.01)

(52) U.S. Cl.
CPC ....... *G01R 31/3606* (2013.01); *G01R 31/362* (2013.01); *H02J 7/0072* (2013.01)

(58) Field of Classification Search
USPC .......................................... 702/63
See application file for complete search history.

(56) References Cited

U.S. PATENT DOCUMENTS

| | | | |
|---|---|---|---|
| 5,633,573 A * | 5/1997 | van Phuoc | G01R 31/3655 320/128 |
| 5,650,712 A * | 7/1997 | Kawai | G01R 31/361 320/DIG. 21 |
| 6,366,054 B1 | 4/2002 | Palanisamy | |
| 7,777,446 B2 | 8/2010 | Ueda et al. | |
| 8,721,712 B2 | 5/2014 | Klocke et al. | |
| 2002/0145430 A1* | 10/2002 | Arai | B60K 6/22 324/426 |

(Continued)

FOREIGN PATENT DOCUMENTS

| | | |
|---|---|---|
| CN | 1720462 | 1/2006 |
| CN | 101688899 | 3/2010 |

(Continued)

*Primary Examiner* — Paul D Lee
(74) *Attorney, Agent, or Firm* — Cozen O'Connor

(57) ABSTRACT

A device for determining at least one range of a battery characteristic curve for a battery in a vehicle, having a measuring device for measuring battery parameters, and an analysis unit including a device for determining the current state of charge (SOC) of the battery from the measured battery parameters, a device for determining a shift value (VW) from the difference of a measured battery parameter and a standard value derived from a standard battery characteristic curve considering the determined state of charge (SOC), and a device for determining at least one range of a new battery characteristic curve by adding the shift value (VW) to the standard battery characteristic curve.

12 Claims, 2 Drawing Sheets

(56) References Cited

U.S. PATENT DOCUMENTS

| | | | | |
|---|---|---|---|---|
| 2003/0195719 A1* | 10/2003 | Emori | ............... | B60W 10/26 |
| | | | | 702/183 |
| 2004/0130296 A1* | 7/2004 | Gross | ............ | G01R 31/3648 |
| | | | | 320/133 |
| 2005/0046388 A1 | 3/2005 | Tate, Jr. | | |
| 2006/0202857 A1* | 9/2006 | Kawahara | ......... | G01R 31/3624 |
| | | | | 340/870.02 |
| 2006/0220619 A1* | 10/2006 | Namba | ............ | G01R 31/3651 |
| | | | | 320/149 |
| 2006/0273802 A1* | 12/2006 | Murakami | ......... | G01R 31/3658 |
| | | | | 324/434 |
| 2007/0182385 A1 | 8/2007 | Ueda et al. | | |
| 2008/0136378 A1 | 6/2008 | Iwahana et al. | | |
| 2008/0204031 A1* | 8/2008 | Iwane | ............... | G01R 31/3624 |
| | | | | 324/430 |
| 2009/0256524 A1* | 10/2009 | Nukui | ............... | G01R 31/3648 |
| | | | | 320/132 |

FOREIGN PATENT DOCUMENTS

| | | |
|---|---|---|
| DE | 294107 A5 | 9/1991 |
| DE | 102007004368 A1 | 8/2007 |
| DE | 102007034041 | 1/2009 |
| DE | 10 2007 037 041 | 2/2009 |
| DE | 102007037041 A1 | 2/2009 |
| EP | 0 931 106 | 7/1999 |
| EP | 1906193 A1 | 4/2008 |
| JP | 11-133123 | 5/1999 |
| KR | 20080054078 | 6/2008 |

\* cited by examiner

DEVICE AND METHOD FOR DETERMINING A RANGE OF A BATTERY CHARACTERISTIC CURVE

CROSS REFERENCE TO RELATED APPLICATIONS

This is a U.S. national stage of application No. PCT/EP2011/051473, filed on 2 Feb. 2011. Priority is claimed on German Application No. 10 2010 006 965.5, filed 5 Feb. 2010, the content of which is incorporated here by reference.

BACKGROUND OF THE INVENTION

1. Field of the Invention

The invention relates to a device and a method for determining a portion of a battery characteristic curve.

2. Description of Prior Art

Energy management in motor vehicles is becoming increasingly significant. The cause is the increasing electrification, that is to say an increased number of electrical devices and loads that have to be supplied with energy. This energy is made available, inter alia, by the vehicle battery. In addition, the individual loads have different priorities in terms of their supply. For example, it is necessary to ensure that safety-related loads are supplied with energy; these include the brakes, the lighting system and airbags. In order to ensure the energy supply of safety-related loads, it is necessary to detect and monitor continuously the state and/or the characteristic variables of the vehicle battery.

An important state variable of the vehicle battery is the state of charge (SOC). A further characteristic variable of the vehicle battery is often referred to as the open circuit voltage (OCV). The state of charge of the vehicle battery can be obtained with this open circuit voltage. To do this, a characteristic OCV/SOC battery characteristic curve can be used. It has been found that a uniform characteristic curve can be used for a large proportion of the batteries of European manufacturers such as, for example, Banner, Exide, and JCI. This OCV/SOC characteristic curve for batteries of European manufacturers is different from the characteristic curves of batteries of manufacturers from other continents, in particular from batteries of Asian manufacturers.

SUMMARY OF THE INVENTION

It is therefore an object of one embodiment of the present invention to make available a device and a method that permit a portion of an OCV/SOC characteristic curve to be determined for a large number of batteries.

A first aspect of one embodiment of the invention comprises a device for determining at least one portion of a battery characteristic curve for a battery in a vehicle, comprising
  a measuring device for measuring battery parameters,
  an evaluation unit comprising
    a device for determining the current state of charge of the battery from the measured battery parameters,
    a device for determining a shift value from the difference between a measured battery parameter and a standard value obtained from a standard battery characteristic curve taking into account the determined state of charge,
    a device for obtaining at least one portion of a new battery characteristic curve by adding the shift value to the standard battery characteristic curve.

The measuring device expediently comprises one or more devices for measuring the voltage, current, temperature, and time. The current is measured, for example, at a standard resistor, referred to as a shunt. The voltage is measured directly at the battery, for example with a resistance divider. The temperature can be measured with a sensor provided for that purpose or a temperature-dependent resistor. The time can be measured by an oscillator, which can be arranged in the device. As a result, significant battery parameters can be measured.

In one advantageous refinement, the evaluation unit comprises a device for determining the shift value from the difference between the measured open circuit voltage of the battery and a standard open circuit voltage, which difference is obtained from a standard battery characteristic curve with the determined state of charge. This ensures that the portion of the battery characteristic curve is obtained by shifting the OCV values.

In a further advantageous refinement, the evaluation device comprises a device for determining the shift value from the difference between the determined state of charge of the battery and a standard state of charge, which difference is obtained from a standard battery characteristic curve with the same open circuit voltage. This ensures that the portion of the battery characteristic curve is obtained by shifting the SOC values.

In one advantageous refinement, the device is integrated into an ASIC (Application Specific Integrated Circuit).

One embodiment of the invention comprises a method for determining at least one portion of a battery characteristic curve of a battery in a vehicle, having the following method steps:
  the current state of charge of the battery is determined from measured battery parameters,
  a shift value is determined from the difference between a measured battery parameter and a standard value determined from a standard battery characteristic curve taking into account the determined state of charge, and
  at least one portion of a new battery characteristic curve is obtained by adding the shift value to the standard battery characteristic curve.

In addition, a battery monitoring device is proposed, comprising
  the device,
  a battery terminal connected mechanically and electrically both to the battery and to the device,
  a measuring resistor which is mechanically and electrically connected to the battery terminal and to the device.

BRIEF DESCRIPTION OF THE DRAWINGS

Further details and advantages are explained with reference to the appended figures.

In said drawings, in each case in schematic form.

In the following description, identical reference symbols denote identical or comparable components.

DETAILED DESCRIPTION OF THE PREFERRED EMBODIMENTS

Figure 1:
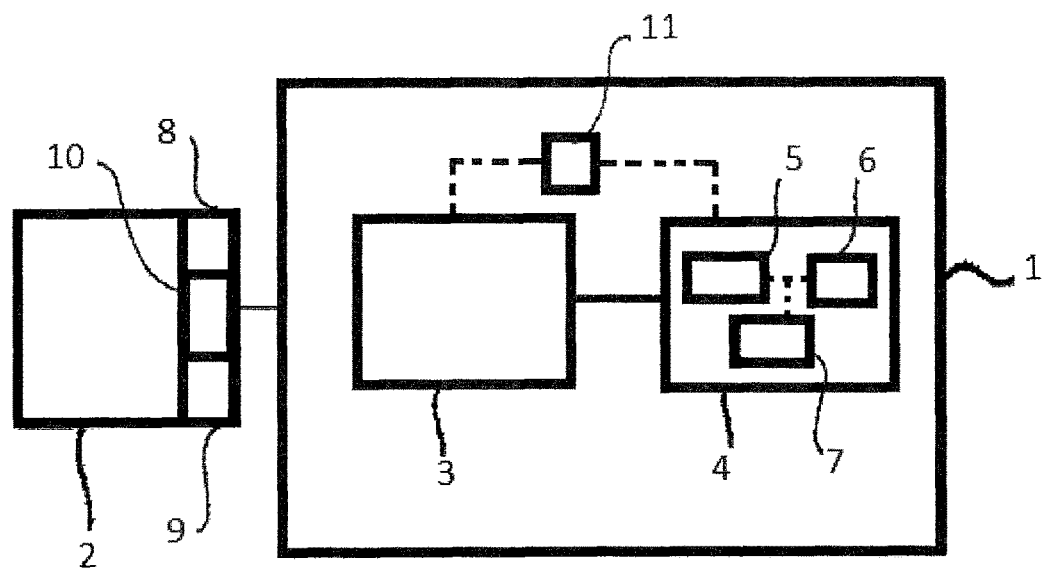
FIG. 1 is a schematic depiction of a device for determining a portion of a battery characteristic curve.

FIG. 1 shows a battery 2 and the device 1, comprising a measuring device 3 and an evaluation unit 4. The measuring device 3 measures battery parameters such as the voltage, current, and also the corresponding time of these measurements. In order to determine at least one portion of the battery characteristic curve, the evaluation unit 4 comprises a device for determining the current state of charge (SOC) of the battery 2 from the measured battery parameters, a device 6 for determining a shift value (VW) from the difference between a measured battery parameter and a standard value obtained from a standard battery characteristic curve taking into account the determined state of charge (SOC), and a device 7 for obtaining at least one portion of a new battery characteristic curve by adding the shift value (VW) to the standard battery characteristic curve.

The current is measured, for example, at a standard resistor, referred to as a shunt 8. The voltage is measured directly at the battery, for example with a resistance divider 9. The temperature can be measured with a sensor provided for that purpose or a temperature-dependent resistor 10. The time can be measured by means of an oscillator 11 which can be arranged in the device.

The state of charge of a battery is the quotient of the current state of charge of the battery 2 and of the maximum state of charge of the battery 2; the maximum state of charge of the battery is therefore specified as a relative value for the total possible charge of the battery 2. The open circuit voltage of the battery 2 is measured when no further chemical reactions are taking place in the battery 2, i.e. as experience has shown after a few hours. The open circuit voltage is also known as OCV and the state of charge is also known as SOC.

In the case of a battery 2, the manufacturer prescribes how much capacity is available. This capacity index is given in ampere hours (Ah). This capacity value corresponds to an SOC of 100% directly after the charging of the battery by the manufacturer. Although batteries in the as-delivered state have a small degree of aging of the battery caused by time, this aging does not have a decisive influence on the overall capacitance or the SOC value of 100%. For this reason, the manufacturer's original capacity value is used to determine the SOC. This value is stored in a vehicle-side memory when a new battery is installed, which memory can be read by the device 1 when necessary. The memory can also be integrated into the device 1. If the battery 2 has a significant reduction in the original capacity owing to the aging process, the current SOC value should be determined in relation to the SOC of 100%. For example, the current capacity could be determined by measuring the current over time when complete discharging occurs.

To determine the current SOC value the extraction of capacity is determined on the basis of a fully charged battery. For this purpose, the outflowing current is measured per time unit by the measuring device 3 and is integrated over time in the evaluation unit 4. The ratio of the specific capacity value to the capacity value in the case of a SOC of 100% corresponds to the current SOC of the battery 2. For example, the capacity of a car battery will be assumed to be 40 Ah in the case of a SOC of 100%. If an outflow of 10 Ah is determined, a SOC of 75% is obtained.

To determine whether a battery is fully charged, the inflowing or outflowing current of the battery is analyzed. A full battery only takes up a small amount of current.

The corresponding OCV value is, as described above, measured by the measuring device 3 after a relatively long quiescent period of the battery 2.

A shift value VW is determined in the evaluation unit 4 from the difference between the measured OCV value and the OCV value of a standard characteristic curve given the same SOC value. For example, the characteristic curve of what are referred to as wet batteries, i.e. lead acid batteries in which the acid between the electrolyte plates of the battery is freely movable, from the manufacturers Banner, Exide, and JCI, can be used as the standard characteristic curve, such as the curve K1 in FIG. 3. This shift value VW corresponds to the value by which the characteristic curve of the new battery is shifted with respect to the standard battery. That is to say only the shift value VW is added to the OCV values of the standard OCV/SOC characteristic curve in order to obtain the OCV/SOC characteristic curve for the current battery 2. In an analogous fashion, when the OCV value is the same it is also possible to add the difference of the SOC value to obtain the new characteristic curve. For this context it is assumed that the OCV/SOC characteristic curves are linear, with the result that the characteristic curve of the current battery 2 is shifted parallel to the standard battery. This shifting is also possible with the SOC value when the OCV value is the same. It is to be noted that in the case of very small and large OCV values, the corresponding SOC value can lie outside the coordinate system. This can be counteracted by virtue of the fact that the characteristic curve is interpolated, starting from the linear portion and extending as far as the desired portion.

It is customary to determine the SOC, OCV and the battery parameter at a temperature of 25° C. For this reason, the temperature is measured during all of the measurements.

Depending on the type of battery, the gradient of the characteristic curves can vary. The battery characteristic data is usually read out from a vehicle-side control device, for example the engine controller, when a new battery is installed. This data can be read out from the engine controller and used by the device according to one embodiment of the invention, and a corresponding comparison characteristic curve and the associated gradient are assigned. It is therefore necessary to store a plurality of customary standard battery characteristic curves in the memory of the device according to one embodiment the invention.

This shift can also be applied to curves that are not linear. A precondition is that the curves are shifted in parallel with one another.

A so-called learning phase usually takes place directly after the initial start of the vehicle, i.e. with a new battery, and ends after the shift value and the characteristic curve have been determined. The learning phase also starts when a new battery has been installed and has been detected as such. The determination of the shift value is repeated until the shift value VW still only has a small, i.e. previously defined, deviation from the previous value.

Furthermore, a battery monitoring device is provided, comprising a device 1, a battery 2, a battery terminal, and a measuring resistor. The battery terminal is mechanically and electrically connected both to the battery 2 and to the device 1. The measuring resistor is mechanically and electrically connected to the battery terminal and to the device 1. Battery parameters such as the voltage and current can be measured with the measuring resistor and used by the device 1 to determine at least one portion of a battery characteristic curve.

Figure 2:
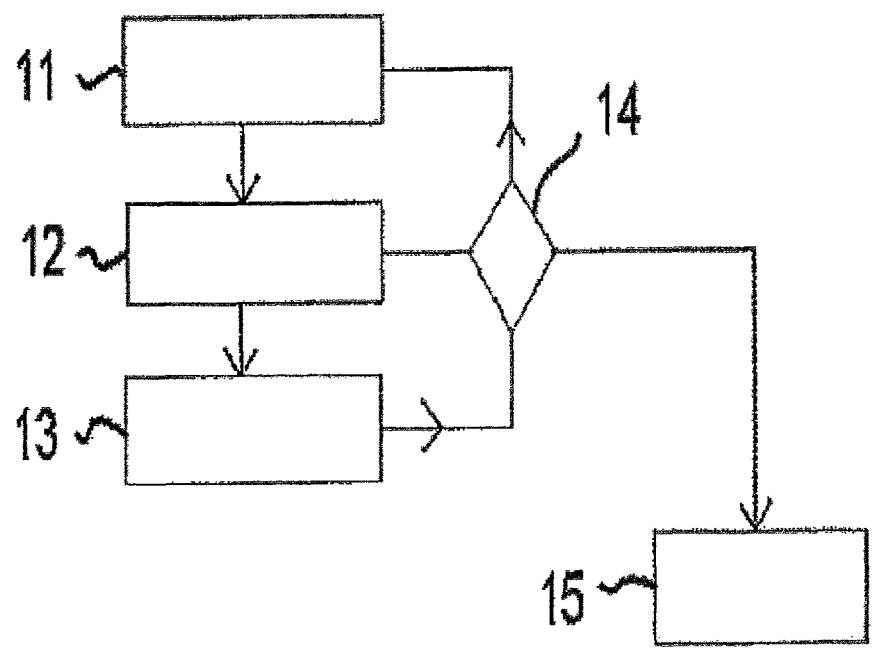
FIG. 2 is a flow chart of a method for determining a portion of a battery characteristic curve.

FIG. 2 is a flowchart for a method for determining a portion of the battery characteristic curve.

In a first step 11, the current SOC value of the battery 2 is determined. This determination can take place by measuring the extracted capacity in the case of a fully charged battery. In this context, the measured current is integrated over time. This measurement and integration can take place during travel or during the starting process.

In a second step 12, the open circuit voltage of the battery 2 is measured. This is done after a relatively long quiescent phase of the battery, with the result that no further chemical reactions take place any more.

The characteristic curve of the standard battery may be a characteristic curve for a battery of a European manufacturer. The corresponding OCV and SOC values of the standard battery can be stored in the evaluation unit 4 or in a memory located outside the evaluation unit 4.

In a third step 13, a shift value VW is determined that represents the difference between the measured OCV value and an OCV value of a standard characteristic curve, wherein the two OCV values are assigned to the same SOC value. That is to say the SOC value at which the OCV value of the present battery 2 has been measured is used to read out from the standard characteristic curve the OCV value. The shift value VW can, however, also be obtained from the difference between the determined SOC value and an SOC value from a standard OCV/SOC characteristic curve.

In a fourth step 14 it is determined how large the difference is between the current calculated shift value VW and the previous shift value VW. The calculation of the shift value VW is repeated, i.e. the method is restarted at step 11, until the current shift value VW still only has a previously defined deviation.

In a fifth step 15, the shift value VW, certified in step 14, is added to the OCV/SOC standard characteristic curve, with the result that a characteristic curve has been determined on the basis of the known characteristic curve.

Figure 3:
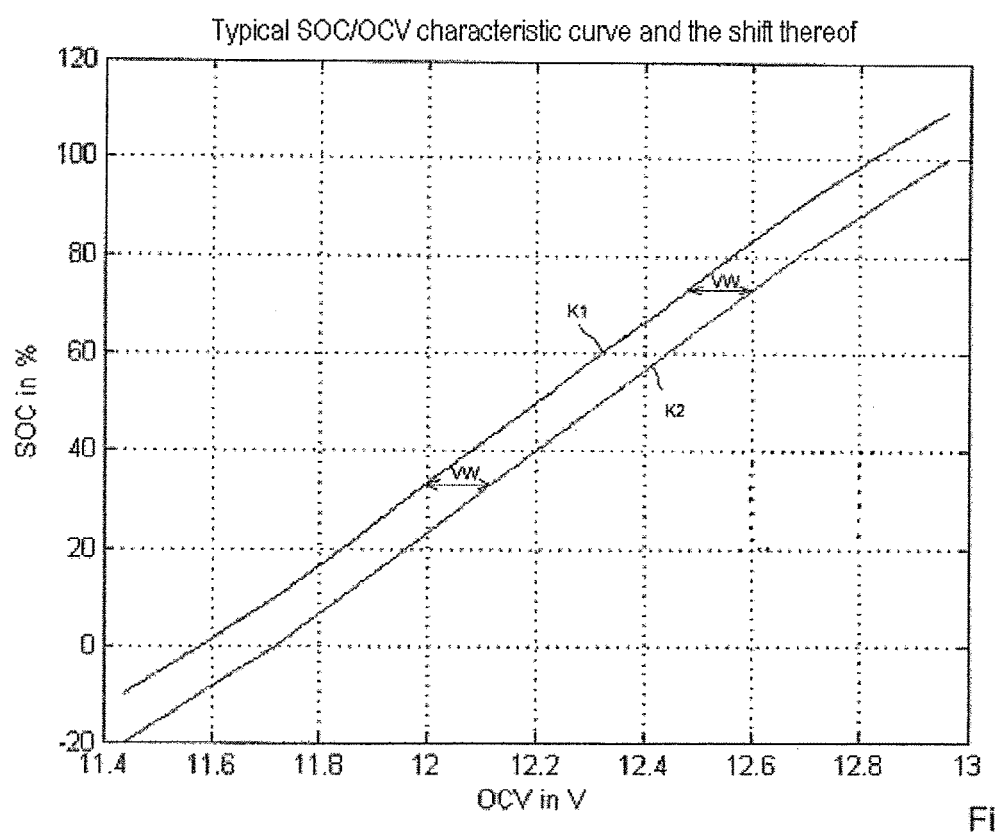
FIG. 3 is a characteristic OCV/SOC characteristic curve.

FIG. 3 shows characteristic curves K1 and K2 of the open circuit voltage OCV for states of charge SOC for example batteries 2. The curve K1 is, as described above, a standard characteristic curve. The characteristic curve K2 is shifted by an OCV shift value VW from the characteristic curve K1. Both characteristic curves K1, K2 are approximately in the SOC portion of 30%-90% straight lines, these gradients can be compared. It is particularly advantageous to obtain a shift value VW in the SOC portion of 30%-90% since the characteristic curves are linear.

The invention is suitable for obtaining portions of battery characteristic curves for motor vehicle batteries.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A device configured to determine at least a portion of a battery characteristic curve for a battery in a vehicle, comprising:
    a measuring device configured to measure a battery parameter; and
    an evaluation unit comprising:
        a first device configured to determine a current state of charge of the battery from the measured battery parameter;
        a second device configured to determine a shift value from a difference between the measured battery parameter and a standard value obtained from a standard battery characteristic curve based at least in part on the determined state of charge; and
        a third device configured to obtain at least one portion of a new battery characteristic curve by adding the shift value to the at least one portion of the standard battery characteristic curve,
        wherein the new battery characteristic curve is used to ensure that one or more safety related loads are supplied with energy,
        wherein the shift value is determined from the difference between the determined state of charge of the battery and a standard state of charge, wherein the difference is obtained from a standard battery characteristic curve with the same open circuit voltage.

2. The device as claimed in claim 1, wherein the measuring device comprises a fourth device configured to measure a voltage and a current of the battery and a time.

3. The device as claimed in claim 2,
    wherein the evaluation unit comprises a fifth device configured to determine the shift value from the difference between a measured open circuit voltage of the battery and a standard open circuit voltage,
    wherein the difference is obtained from a standard battery characteristic curve with the determined current state of charge.

4. The device as claimed in claim 2,
    wherein the evaluation unit comprises a fifth device configured to determine the shift value from the difference between the determined state of charge of the battery and a standard state of charge.

5. The device as claimed in claim 1, wherein the device is integrated into an ASIC.

6. A battery monitoring device, comprising:
    a measuring device configured to measure a battery parameter; and
    an evaluation unit comprising:
        a first device configured to determine a current state of charge of the battery from the measured battery parameter;
        a second device configured to determine a shift value from a difference between the measured battery parameter and a standard value obtained from a standard battery characteristic curve based at least in part on the determined state of charge; and
        a third device configured to obtain at least one portion of a new battery characteristic curve by adding the shift value to the at least one portion of the standard battery characteristic curve;
    a battery terminal connected mechanically and electrically both to the battery and to the device; and
    a measuring resistor mechanically and electrically connected to the battery terminal and to the device,
    wherein the new battery characteristic curve is used to ensure that one or more safety related loads are supplied with energy,
    wherein the shift value is determined from the difference between the determined state of charge of the battery and a standard state of charge, wherein the difference is obtained from a standard battery characteristic curve with the same open circuit voltage.

7. A method for determining at least one portion of a battery characteristic curve of a battery in a vehicle, comprising:
- determining a current state of charge of the battery from a measured battery parameter;
- determining a shift value from a difference between the measured battery parameter and a standard value determined from a standard battery characteristic curve based at least in part on the determined state of charge; and
- obtaining at least one portion of a new battery characteristic curve by adding the shift value to the standard battery characteristic curve,
- ensuring that one or more safety related loads are supplied with energy using the new battery characteristic curve,
- wherein the shift value is determined from the difference between the determined state of charge of the battery and a standard state of charge, wherein the difference is obtained from a standard battery characteristic curve with the same open circuit voltage.

8. The method as claimed in claim 7, wherein the shift value is determined from the difference between a measured open circuit voltage of the battery and a standard open circuit voltage, wherein the difference is obtained from a standard battery characteristic curve with the determined state of charge.

9. The method as claimed in claim 7, further comprising determining the current state of charge of the battery by a ratio of a discharged capacity to a maximum capacity of the battery.

10. The method as claimed in one of claim 9, further comprising determining the discharged capacity of the battery by integrating a measured current of the battery over time.

11. The method as claimed in one of claim 10, wherein a discharging current of the battery is measured during a starting process of the vehicle.

12. The method as claimed in one of claim 11, wherein the battery characteristic curve is obtained in a range of 30% to 90% of an SOC portion.

* * * * *